United States Patent [19]

Sohn

[11] Patent Number: 5,896,345

[45] Date of Patent: Apr. 20, 1999

[54] ROW DECODER FOR A SEMICONDUCTOR MEMORY DEVICE

[75] Inventor: Seon Ick Sohn, Ichon, Rep. of Korea

[73] Assignee: Hyundai Electronics Industries Co., Ltd., Ichon, Rep. of Korea

[21] Appl. No.: 08/998,890

[22] Filed: Dec. 29, 1997

[30] Foreign Application Priority Data

Dec. 31, 1996 [KR] Rep. of Korea ............... 1996-80213

[51] Int. Cl.[6] .................................................. G11C 8/00
[52] U.S. Cl. .................. 365/230.06; 365/189.08; 365/189.11; 365/230.08
[58] Field of Search .................. 365/230.06, 189.08, 365/189.11, 230.08

[56] References Cited

U.S. PATENT DOCUMENTS

| | | |
|---|---|---|
| 5,148,401 | 9/1992 | Sekino et al. |
| 5,402,386 | 3/1995 | Tavrow et al. ............... 365/230.06 |
| 5,412,331 | 5/1995 | Jun et al. ............... 326/105 |
| 5,490,119 | 2/1996 | Sakurai et al. ............... 365/230.08 |
| 5,781,497 | 7/1998 | Patel et al. ............... 365/230.06 |

*Primary Examiner*—David Nelms
*Assistant Examiner*—Hien Nguyen
*Attorney, Agent, or Firm*—Thelen Reid & Priest LLP

[57] ABSTRACT

A row decoder for a semiconductor memory device including a pull-up signal generating part producing pull-up signals in response to output signals of a row address predecoder and applying the pull-up signals across word line driving part; and a pull-down signal generating part producing pull-down signals in response to output signals of the row address predecoder and applying the pull-down signals across the word line driving part. A pair of pull-up signals among the pull-up signals share one of the pull-down signals, thus controlling the word line driving part. The pull-down signal generating part includes NOR gates that perform NOR operation with respect to the output signals of the row address predecoder and the pull-up signals of the pull-up signal generating part, thus outputting the pull-down signals.

4 Claims, 5 Drawing Sheets

ROW DECODER FOR A SEMICONDUCTOR MEMORY DEVICE

BACKGROUND OF THE INVENTION

1. Field of the Invention

The present invention generally relates to a row decoder for a semiconductor memory device. More particularly, it relates to a row decoder for a semiconductor memory device in which a pair of pull-up signals among pull-up/pull-down signals, applied to a word line driver, share one pull-down signal, thus driving eight word lines with only the pair of the pull-up signals and the single pull-down signal.

2. Description of the Prior Art

The metal strapping structure or hierarchic word line structure is generally used to drive word lines of a semiconductor memory device.

According to the metal strapping structure, metal lines are arranged on a cell array by word line pitch to be each connected with polysilicon word lines, thereby reducing the resistance of each word line and assuring the high-speed performance. Pitch is the sum of a line width and a line space of each line arranged at regular intervals. In the metal strapping structure, the higher the degree of integration of a memory device becomes, the more the word line pitch is reduced, and failure occurs more frequently in metallization, thus having a disadvantageous yield aspect. Thus, a high-integration memory device such as a 64M dynamic random access memory (DRAM) employs a hierarchic word line structure in which a plurality of hierarchic word line driver circuits are shared for a row decoder's output and divided by a sub-row decoder (pxi generator). Such a hierarchic word line structure may loosen the strict design rule of metallization. FIG. 1 is a circuit diagram of a conventional row decoder for driving a sub-word line. FIG. 2 is a timing diagram of each signal in connection with FIG. 1.

The following description concerns the operation of the conventional row decoder.

A row decoder enable signal (a)xdpd is driven to an active logic state "high" from "low", and row address signals ax23, ax45 and ax67 change their logic states from "low" to "high". If the signal of logic state "high" is transmitted to one node of a transfer gate having a gate to which a power supply voltage Vxg ("Vcc" level), potential signal, and a word line boosting signal pxi(c) is input thereto, bootstrapping occurs so that a value of Vpp, pxi level, is transmitted to the word lines, thus making the word lines active. If a pd node's output, pull-up signal, maintains a logic state "low", and a pu node's output, pull-up signal, goes "low" (precharged state), the pu node's output goes "high" to discharge the word lines.

As described above, the conventional row decoder produces a pair of pull-up and pull-down signals pu<0:3>, pd<0:3>; i.e. pu<0>, pd<0>, pu<1>, pd<1>, pu<2>, pd<2>, pu<3>, and pd<3>, thus actuating memory columns. That is, the conventional row decoder outputs and uses a pair of pull-up and pull-down signals to drive four different word lines. Accordingly, two pairs of pull-up and pull-down signals are needed to drive eight word lines.

SUMMARY OF THE INVENTION

Accordingly, the present invention is directed to a row decoder for a semiconductor memory device that substantially obviates one or more of the problems due to limitations and disadvantages of the related art.

It is an object of the present invention to provide a row decoder for a semiconductor memory device which can drive eight word lines with two pull-up signals and one pull-down signal shared by the two pull-up signals.

It is another object of the present invention to provide a row decoder for a semiconductor memory device which increases pull-up/pull-down line space and width at the time of metallization by sharing one pull-down signal line, thus enhancing the production yield.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, there is disclosed a row decoder for a semiconductor memory device including a pull-up signal generating part producing pull-up signals in response to output signals of a row address predecoder and applying the pull-up signals across word line driving part; and a pull-down signal generating part producing pull-down signals in response to output signals of the row address predecoder and applying the pull-down signals across the word line driving part. A pair of pull-up signals among the pull-up signals share one of the pull-down signals, thus controlling the word line driving part.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings:

DETAILED DESCRIPTION OF PREFERRED EMBODIMENT

Figure 1:
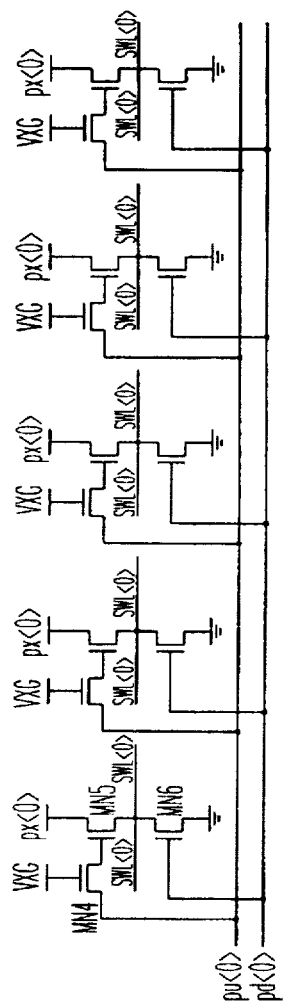
FIG. 1 is a circuit diagram of a conventional row decoder for driving a sub-word line.
Figure 1:
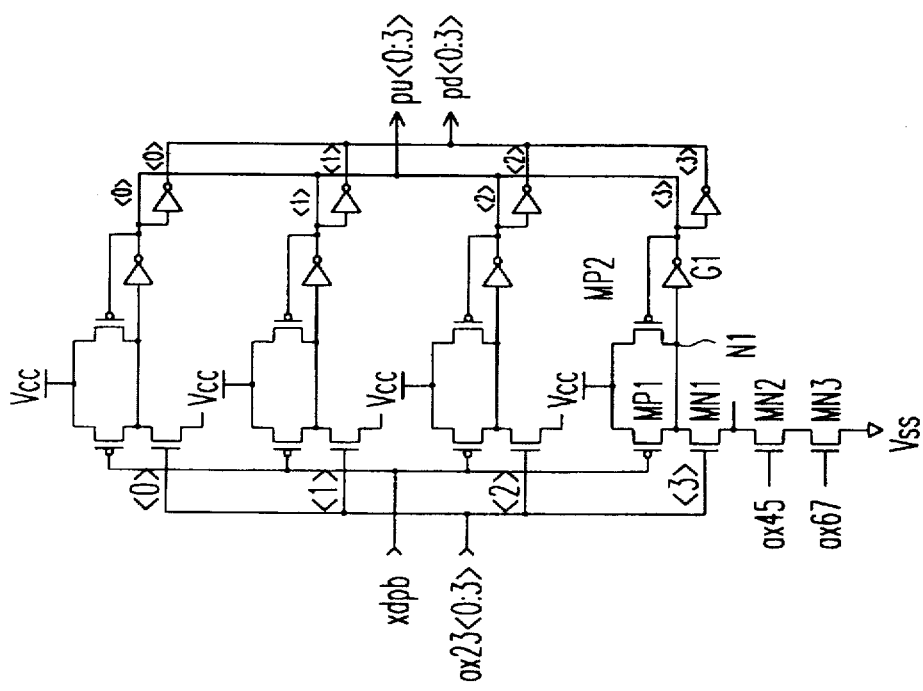
Figure 2:
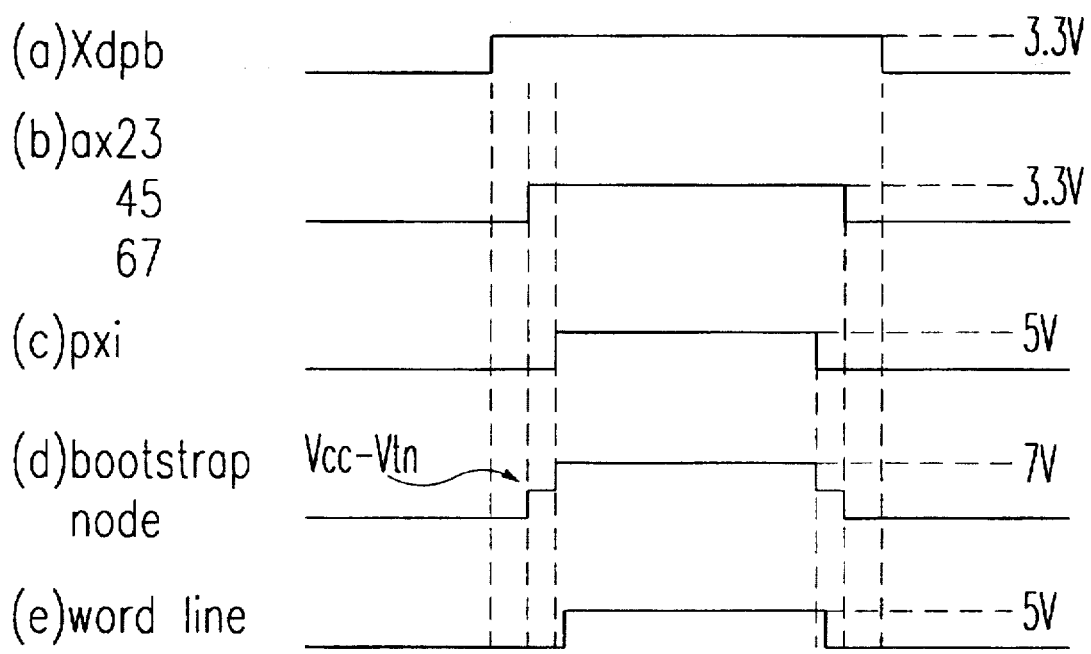
FIG. 2 is a timing diagram of each signal of FIG. 1.

Reference will now be made in detail to the preferred embodiments of the present invention, examples of which are illustrated in the accompanying drawings. Similar reference numerals denote similar reference parts throughout the specification and drawings.

Figure 3:
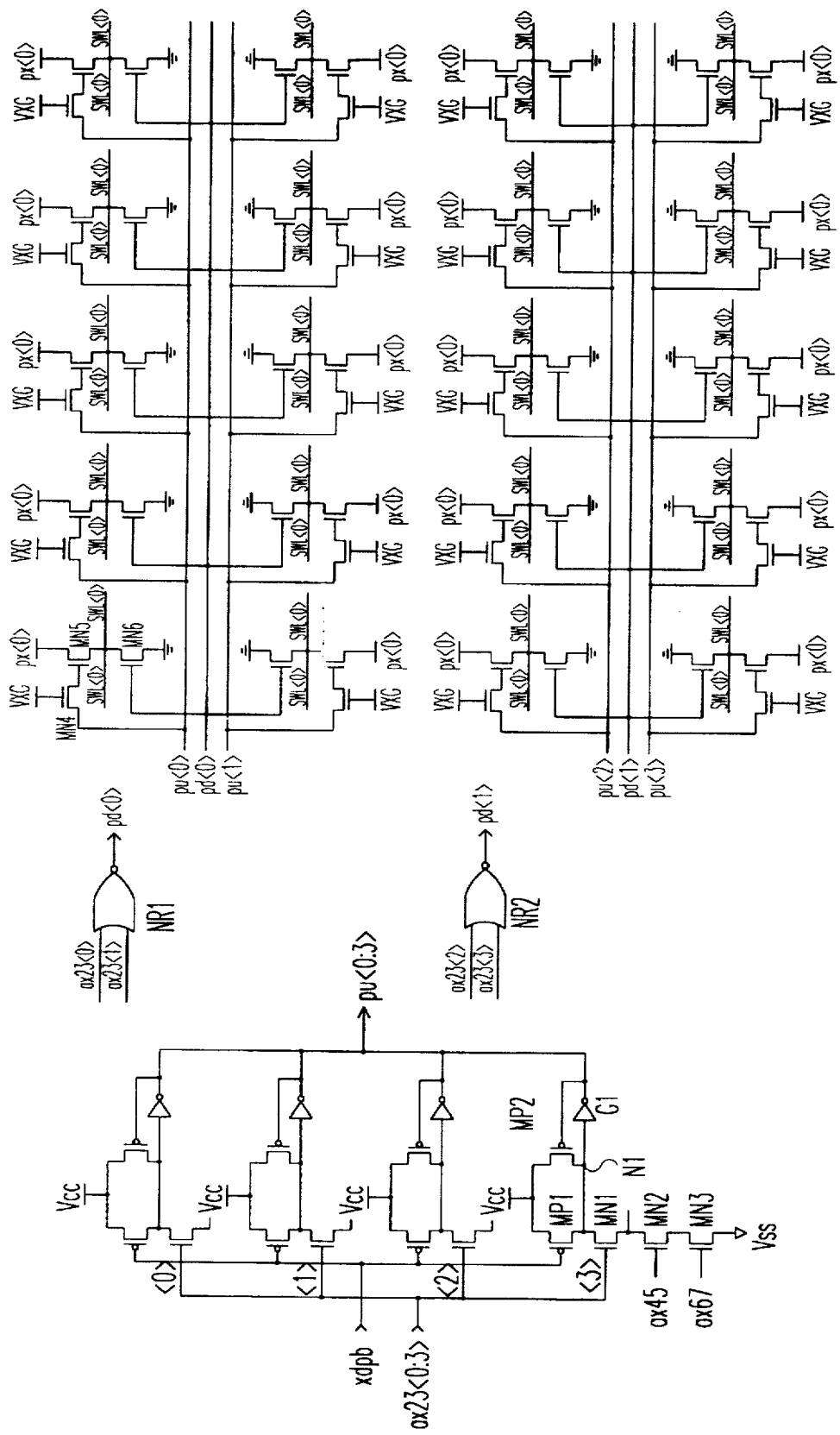
FIG. 3 is a circuit diagram of a row decoder for a semiconductor memory device in accordance with a first preferred embodiment of the present invention.

FIG. 3 is a circuit diagram of a row decoder for a semiconductor memory device in accordance with a first preferred embodiment of the present invention. The row decoder includes a pull-up signal generating part producing pull-up signals pu<0:3>; i.e. pu<0>, pu<1>, pu<2> and pu<3> responsive to signals ax23<0:3>, produced from a row address predecoder (not illustrated); a pull-down signal generating part producing pull-down signals pd<0> and pd<1> to disable word lines; and a word line driver in which two of the above pull-up signals share one of the pull-down signals to selectively drive word lines.

The pull-down signal generating part consists of NOR gates each producing pull-down signals pd<0> and pd<1> upon application of address signals ax<0:3>; i.e. ax<0>, ax<1>, ax<2>, and ax<3>. The NOR gates perform a NOR operation with respect to address signals ax23<0> and ax23<1>, thus outputting the pull-down signal pd<0>, and perform a NOR operation of address signals ax23<2> and ax23<3> to produce the pull-down signal pd<1>.

The word line driver includes a bootstrap transistor MN4 connected between a pull-up signal input node and a bootstrap node, and having a gate terminal receiving a power supply voltage VXG of Vcc level; a pull-up transistor MN5 connected between a word line boosting signal line px<0> and a sub-word line SWL<0>, and having a gate terminal connected to the bootstrap node; a pull-down transistor MN6 connected between the sub-word line and ground, and a gate terminal receiving the pull-down signal.

As depicted in FIG. 3, the pull-up signals pu<0> and pd<1> share the pull-down signal pd<0>, and pull-up signals pu<2> and pd<3> share the pull-down signal pd<1>. Unlikely the conventional row decoder in which the pull-up signals pu<0>, pu<1>, pu<2>, and pu<3> each correspond to the pull-down signals pd<0>, pd<1>, pd<2>, and pd<3>, in the present invention, a pair of pull-up signals share a single pull-down signal, thus assuring reduction in the number of the metallization steps and enhancement of processing margin.

Figure 4:
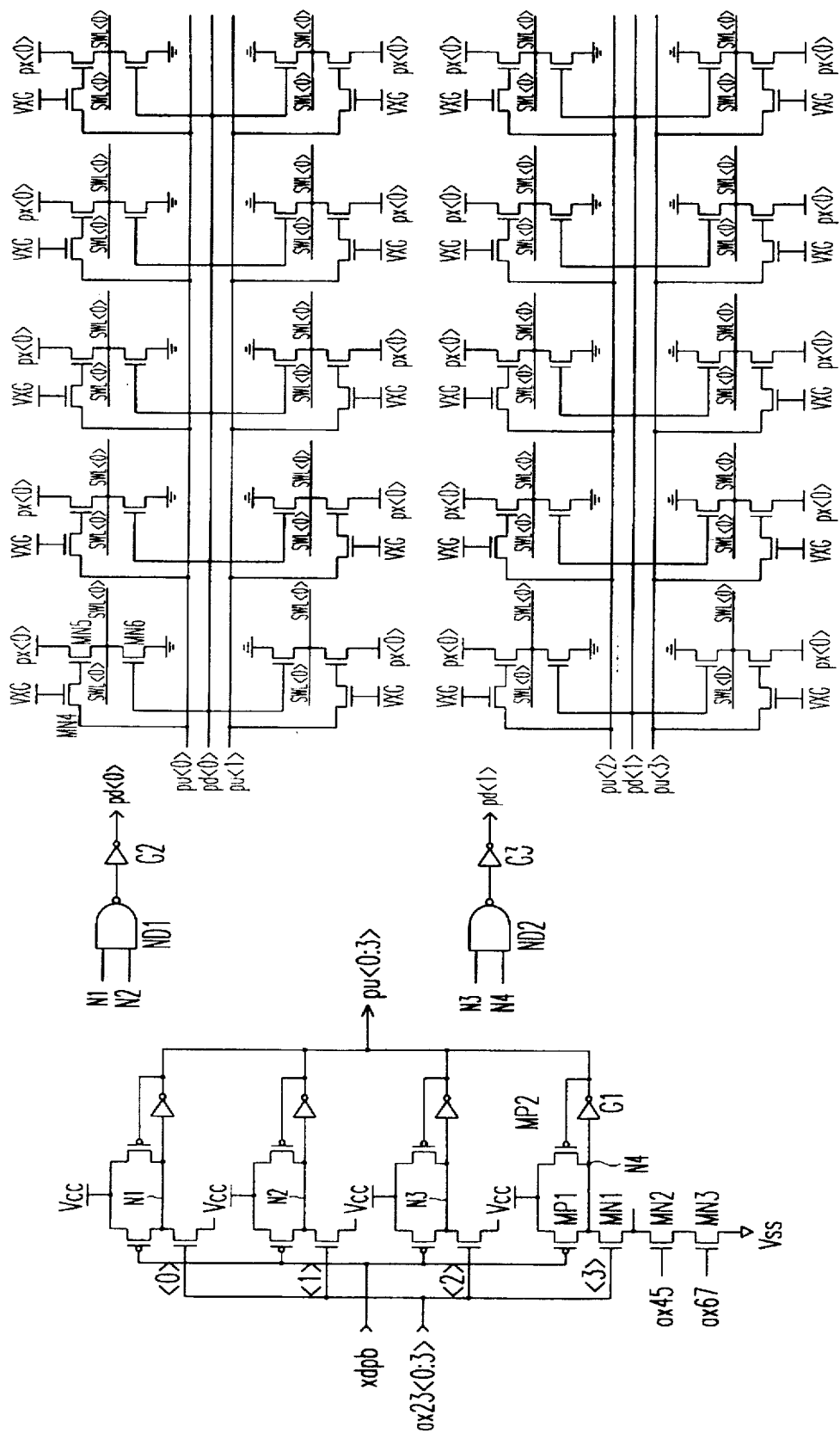
FIG. 4 is a circuit diagram of a row decoder for a semiconductor memory device in accordance with a second preferred embodiment of the present invention.

FIG. 4 is a circuit diagram of a row decoder for a semiconductor memory device in accordance with a second preferred embodiment of the present invention. The row decoder of the second preferred embodiment is similar to the first preferred embodiment's in construction and operation except a pull-down signal generating part.

The pull-down signal generating part of FIG. 4 outputs a logical product, a pull-down signal, of each output signal of nodes N1, N2, N3 and N4 for disabling word lines. More specifically, the pull-down signal generating part performs an AND operation with respect to signals of nodes N1 and N2, to thereby produce a pull-down signal pd<0>, and performs an AND operation with respect to signals of nodes N3 and N4, thus outputting a pull-down signal pd<1>. The AND operation is performed by NAND gates and inverters of the pull-down signal generating part.

Figure 5:
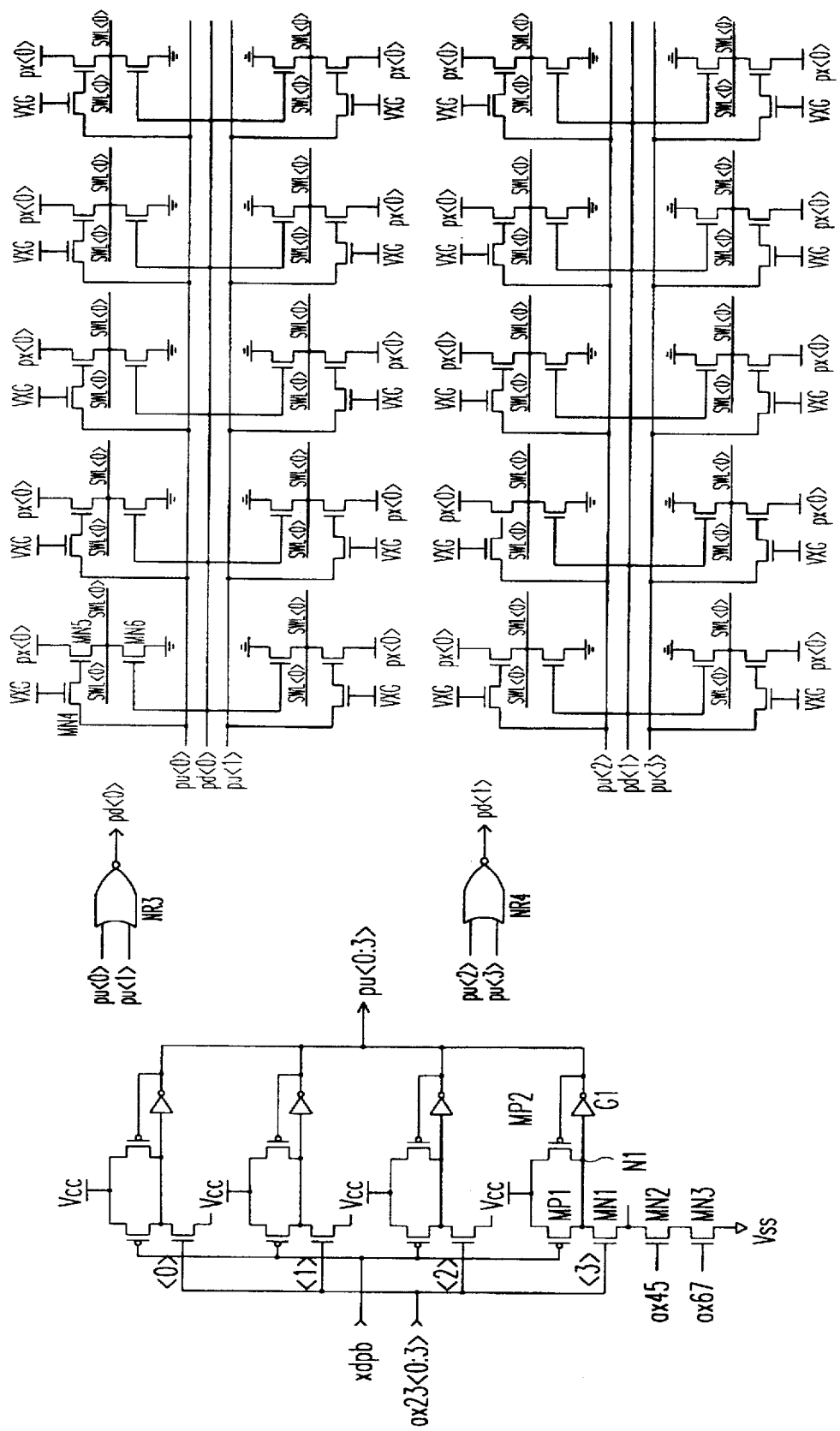
FIG. 5 is a circuit diagram of a row decoder for a semiconductor memory device in accordance with a third preferred embodiment of the present invention.

FIG. 5 is a circuit diagram of a row decoder for a semiconductor memory device in accordance with a third preferred embodiment of the present invention.

The third preferred embodiment of the present invention is similar to the first and second preferred embodiments in construction and operation except a pull-down signal generating part. The pull-down signal generating part of FIG. 5 outputs a logical product of each pull-up signal pu<0:3> for disabling word lines. That is, the pull-down signal generating part performs a NOR operation of pull-up signals pu<0> and pu<1> to output a pull-down signal pd<0>, and performs a NOR operation of pull-up signals pu<0> and pu<1>, thereby producing a pull-down signal pd<1>.

In the first to third preferred embodiments of the present invention, a single pull-down signal line, provided to the word line driver, is used, unlikely the conventional row decoder.

Thus, according to the present invention, eight word lines are driven by a pair of pull-up signals and a pull-down signal, shared by the pull-up signals, which differs from the conventional row decoder needing two pairs of pull-up and pull-down signals for driving eight word lines.

As described above, in the inventive row-decoder circuit a pull-down signal is shared among pull-up/pull-down signals that are input to the word line driver, which increases pull-up and pull-down line space and width in metallization, thus enhancing the production yield.

It will be apparent to those skilled in the art that various modifications and variations can be made in the row decoder of the present invention without departing from the spirit or scope of the invention. Thus, it is intended that the present invention cover the modifications and variations of this invention provided they come within the scope of the appended claims and their equivalents.

What is claimed is:

1. A row decoder for a semiconductor memory device comprising:

pull-up signal generating means producing pull-up signals in response to output signals of a row address predecoder and applying said pull-up signals across word line driving means; and pull-down signal generating means producing pull-down signals in response to output signals of the row address predecoder and applying said pull-down signals across the word line driving means, a pair of pull-up signals among said pull-up signals sharing one of the pull-down signals, thus controlling the word line driving means.

2. A row decoder for a semiconductor memory device according to claim 1, wherein said pull-down signal generating means includes NOR means that performs a NOR operation with respect to the output signals of the row address predecoder, thus outputting the pull-down signal.

3. A row decoder for a semiconductor memory device according to claim 1, wherein said pull-down signal generating means includes NAND means that performs a NAND operation with respect to the pull-up signals of the pull-up signal generating means, thus outputting the pull-down signal.

4. A row decoder for a semiconductor memory device according to claim 1, wherein said word line driving means includes:

a bootstrap transistor connected between a bootstrap node and a node receiving the pull-up signals, and having a gate terminal to which a power supply voltage is applied;

a pull-up transistor connected between a word line boosting signal line and a sub-word line and having a gate terminal connected to the bootstrap node; and a pull-down transistor connected between the sub-word line and ground, and having a gate terminal receiving the pull-down signals.

* * * * *